United States Patent [19]
Northrup et al.

[11] Patent Number: 5,376,583
[45] Date of Patent: Dec. 27, 1994

[54] METHOD FOR PRODUCING P-TYPE IMPURITY INDUCED LAYER DISORDERING

[75] Inventors: John E. Northrup, Palo Alto; Thomas L. Paoli, Los Altos, both of Calif.

[73] Assignee: Xerox Corporation, Stamford, Conn.

[21] Appl. No.: 174,911

[22] Filed: Dec. 29, 1993

[51] Int. Cl.$^5$ .................................... H01L 21/20
[52] U.S. Cl. .................. 437/133; 437/126; 437/129; 437/174
[58] Field of Search ............... 437/174, 173, 168, 169, 437/126, 133, 129

[56] References Cited

U.S. PATENT DOCUMENTS

| | | | |
|---|---|---|---|
| 3,622,952 | 8/1966 | McCaldin | 148/DIG. 2 |
| 4,654,090 | 3/1987 | Burnham et al. | 437/174 |
| 4,824,798 | 4/1989 | Burnham et al. | 437/81 |
| 4,987,468 | 1/1991 | Thornton | 357/34 |
| 5,013,684 | 5/1991 | Epler et al. | 437/129 |
| 5,038,185 | 8/1991 | Thornton | 357/17 |
| 5,062,115 | 10/1991 | Thornton | 372/50 |

FOREIGN PATENT DOCUMENTS 0262415 11/1987 Japan ........................... 437/174

OTHER PUBLICATIONS

"The Diffusion of Silicon in Gallium Arsenide", G. R. Antell, 1965, Solid-State Electronics, vol. 8 pp. 943-946.

"Diffusion of silicon in gallium arsenide using rapid thermal processing: Experimental and model", Greiner et al., Applied Physics Letters, vol. 44(8) pp. 750-752 (Apr. 15, 1984).

"Disorder of an Al$_x$Ga$_{1-x}$As-GaAs Superlattice by Donor Diffusion", K. Meehan, et al., Applied Physics Letters, vol. 45(5), pp. 549-551, (Sep. 1, 1984).

"Design of Fabry-Perot Surface-Emitting Lasers with a Periodic Gain Structure", S. W. Corzine et al., IEEE Journal of Quantum Electronics, vol. 25, No. 6, pp. 1513-1524, Jun. 1989.

"Fabrication of Low Threshold Voltage Microlasers", Scherer et al., Electronics Letters, vol. 28, No1. 13, pp. 1224-1226, Jun. 18, 1992.

"Channelling photodiode: A new versatile interdigitated p-n junction photodetector", F. Capasso et al., Applied Phys. Lett. 41(1), pp. 944-946, Nov. 15, 1982.

"Doping (n-i-p-i) Superlattices", G. Döhler et al., Academic Press, Inc., Synthetic Modulated Structures, pp. 163-214, 1985.

Primary Examiner—R. Bruce Breneman
Assistant Examiner—Ramamohan Rao Paladugu
Attorney, Agent, or Firm—Oliff & Berridge

[57] ABSTRACT

P-type impurity induced layer disordering (IILD) in compound semiconductor structures or multilayer semiconductor material structures is produced by providing a source of a disordering agent during annealing multiple layers of III-V semiconductor material at high temperature under Group III material-rich conditions. For example, diffusion of silicon causes impurity induced layer disordering of GaAs/AlGaAs quantum well structures. By diffusing the silicon under gallium-rich conditions or from a gallium-rich source layer, the desired disordering is achieved simultaneously with p-type doped material. Silicon is an amphoteric dopant in gallium arsenide. Silicon occupies the gallium and arsenic sites with comparable frequencies with predominantly occupied site determined by the arsenic and gallium chemical potentials. Diffusion of silicon causes impurity induced layer disordering (IILD) of GaAs/AlGaAs quantum well structures. In this method, silicon is used to produce layer disordering in GaAs/AlGaAs heterostructures. The heterostructure material doped with silicon is annealed under extreme gallium-rich conditions or under a gallium-rich source layer to achieve the desired disordering simultaneously p-type doped material.

20 Claims, 6 Drawing Sheets

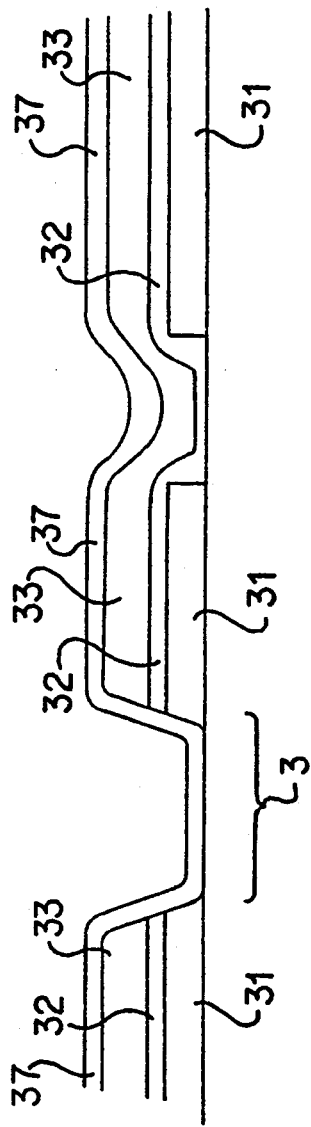
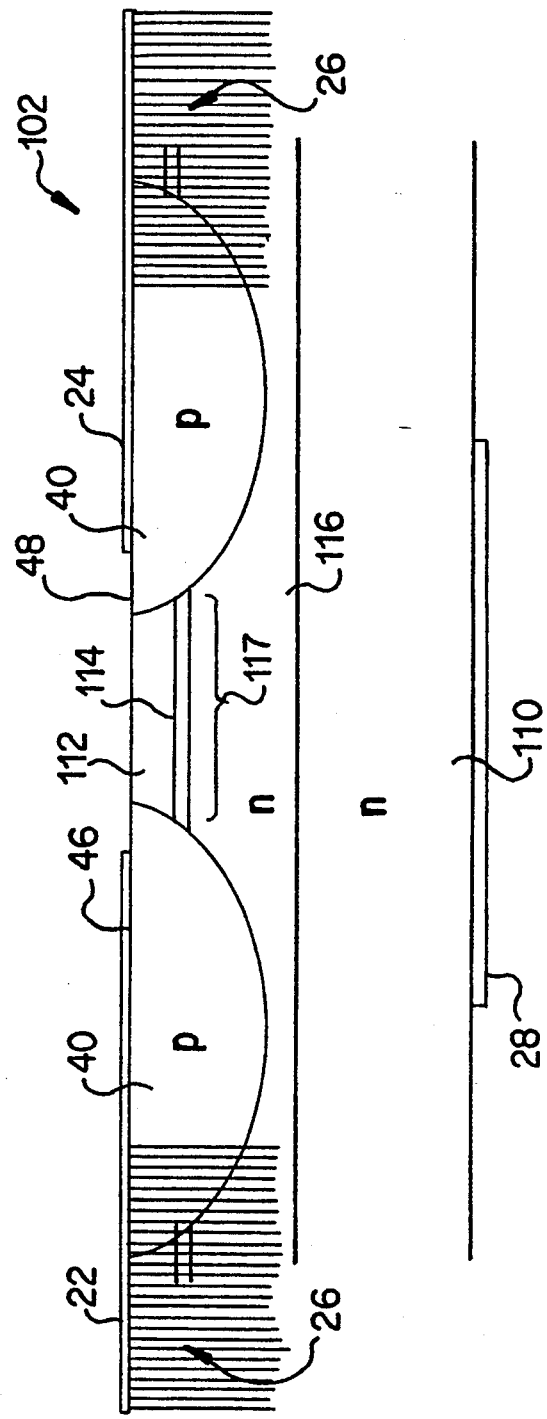

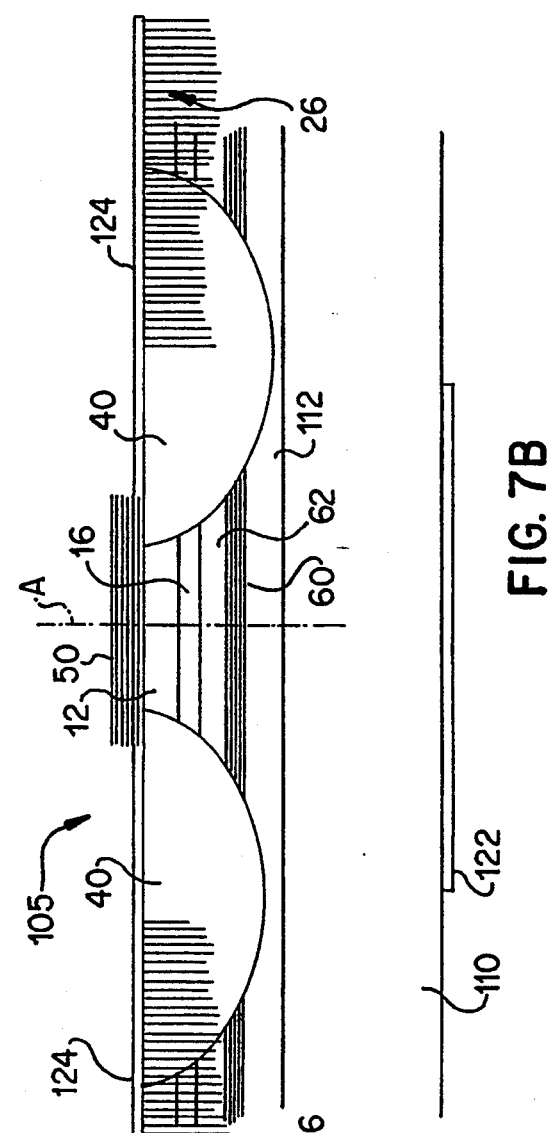
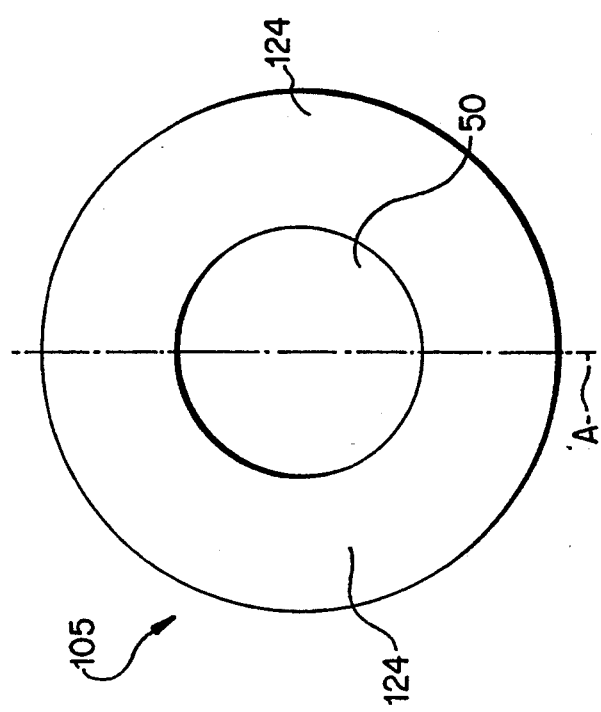

METHOD FOR PRODUCING P-TYPE IMPURITY INDUCED LAYER DISORDERING

BACKGROUND OF THE INVENTION

1. Field of the Invention

The invention relates to a method for producing a p-type doped material by doping a heterostructure semiconductor material, especially gallium arsenide/aluminum gallium arsenide (GaAs/AlGaAs), with silicon (Si) and annealing the doped semiconductor material under extreme gallium (Ga) rich conditions to obtain p-type materials having wide bandgaps.

2. Related Art

Impurity diffusion into group III-V compound semiconductors is an important step in the fabrication of opto-electronic devices. Recently the field has given much attention to the diffusion of silicon into gallium arsenide. The field has also recently given considerable attention to impurity induced disordering (IID) in GaAs/AlGaAs quantum well structures.

In particular, the diffusion of silicon into gallium arsenide has been investigated. For example, "The diffusion of Si in GaAs", G. R. Antell Solid State Electronics, Vol. 8, pp. 943-946 (1965), discloses the diffusion of silicon into gallium arsenide carried out at high temperatures in a sealed quartz capsule containing an overpressure of arsenic to prevent the diffusion of the arsenic out of the gallium arsenide substrate. The diffusivity and activation of silicon in gallium arsenide is proportional to the arsenic overpressure and the gallium vacancy concentrations. However, annealing the doped material in an arsenic overpressure environment produces a n-type doped material.

In "Diffusion of Si in Using Rapid Thermal Processing: Experiment and Model", M. E. Greiner et al. Applied Physics Letters, Vol. 44(8), pp. 750-752 (Apr. 15, 1984) discloses silicon diffusion from a thin, elemental-deposited silicon source, by using rapid thermal processing with several different encapsulants. The model discloses that paired silicon atoms move substitutionally by exchanging sites with either gallium or arsenic vacancies.

It is well known in the art that p-type layer disordered regions can be produced by diffusing zinc into layered heterostructures of III-V compounds such as GaAs/AlGaAs. However, silicon is a much preferred disordering impurity, because silicon produces a much more abrupt and reproducible transition from disordered to ordered material than zinc. However silicon, as presently used by the field in layer disordering, produces only n-type doped materials, e.g. see "Disorder of an $Al_xGa_{1-x}As GaAs$ Superlattice by Donor Diffusion", K. Meehan, et al., Applied Physics Letters, Vol. 45(5), pp. 549-551 (Sep. 1, 1984). Therefore, there has been a long-felt need in the art for p-type layer disordering having transitional abruptness similar to that produced by n-type silicon diffusion.

SUMMARY OF THE INVENTION

This invention obtains p-type doped layer disordered regions by diffusing the layered heterostructure semiconductor materials with silicon or germanium, and annealing the doped materials under gallium-rich conditions.

This invention further provides for forming various heterostructure semiconductor devices using the method for forming p-type doped and layer disordered heterostructure semiconductor materials.

According to this invention, multiple layers of different composition are intermixed to form regions of p-type doped semiconductor material by impurity induced disordering. More specifically, p-type doped and intermixed material is produced by doping multilayer semiconductor material structures with silicon and annealing the doped material under gallium-rich conditions. Further, the multilayer semiconductor material is preferably GaAs/AlGaAs.

The method of this invention comprises the steps of introducing an impurity species onto the surface of a III-V semiconductor structure, the impurity species preferably being silicon or germanium, then annealing the doped material under gallium-rich conditions at a temperature sufficient to diffuse the impurity species into the multilayer semiconductor material. Ga-rich conditions may be obtained in either of two ways: (1) The Si (or Ge) source, which is in direct contact with the GaAs, is heavily doped with Ga so that the concentration of Ga is approximately 10%. (2) Alternately a piece of Ga may be placed in the sealed ampoule. For an ampoule volume of 3 $cm^3$, an amount of Ga weighing between 20 and 60 mg may be employed to obtain Ga rich conditions.

This method of the invention is based on calculations of the energetics of silicon dopants and defects in gallium arsenide. The calculations indicate that defect concentrations vary as a function of the arsenic and gallium chemical potentials. The chemical potentials may vary over a certain range, which is determined by thermodynamic considerations. In arsenic-rich conditions, the chemical potential of arsenic is high, while the chemical potential of gallium is low. In contrast, in gallium-rich conditions, the chemical potential of gallium is high, while the chemical potential of arsenic is low. However, the sum of the chemical potentials of gallium and arsenic is constant. The gallium-rich conditions are obtained by placing the heterostructure material having a silicon top layer and bulk gallium in an annealing ampoule or by depositing a gallium-rich source layer of silicon on the heterostructure substrate.

In a preferred embodiment, the method of producing the p-type doped material by introducing impurity species into the III-V semiconductor structure comprises the steps of chemically depositing a silicon diffusion source layer on the surface of a III-V multilayer structure, chemically depositing a cap layer of, for example, $SiO_2$ or $Si_3N_4$, on the silicon diffusion source layer; and annealing the doped semiconductor material at a high temperature in a gallium-rich environment. The annealing process is carried out in the temperature range of 500-1000 degrees C. Annealing the material thermally diffuses the silicon into the III-V multilayer structure, causing a layered disordering in the material. The gallium rich environment produces p-type doped layer disordered regions.

Other objects and advantage, together with a fuller understanding of the invention, will become apparent and appreciated by referring to the following description and claims taken in conjunction with the accompanying drawings.

BRIEF DESCRIPTION OF THE DRAWINGS

The invention will be described in relation to the following drawings in which like reference symbols refer to like elements and wherein:

FIG. 4 is a cross-sectional view of the laterally injected diode laser of FIG. 2 showing a second embodiment of the present method prior to annealing;

FIG. 5 is a cross-sectional view a P-N-P bipolar transistor formed of the material made by the present invention;

FIG. 7A is a top plan view of a laterally injected surface emitter formed from the material made by the present method;

FIG. 7B is a cross-sectional view of a laterally injected surface emitter formed from the material made by the present method.

DETAILED DESCRIPTION OF THE PREFERRED EMBODIMENTS

Under arsenic-rich conditions, it is well-known that silicon acts as a donor and is believed to diffuse by forming a mobile complex with a gallium vacancy. On the other hand, the inventors of the method of this invention have determined that in gallium-rich conditions, silicon prefers to occupy the arsenic site and consequently acts as an acceptor. Because silicon diffuses under gallium-rich conditions by forming a complex with a gallium interstitial, it is possible to use silicon, in conjunction with gallium-rich annealing conditions or in a gallium-rich source layer, to obtain p-type wide bandgap regions by disordering layered heterostructures of GaAs and AlGaAs.

Figure 1:
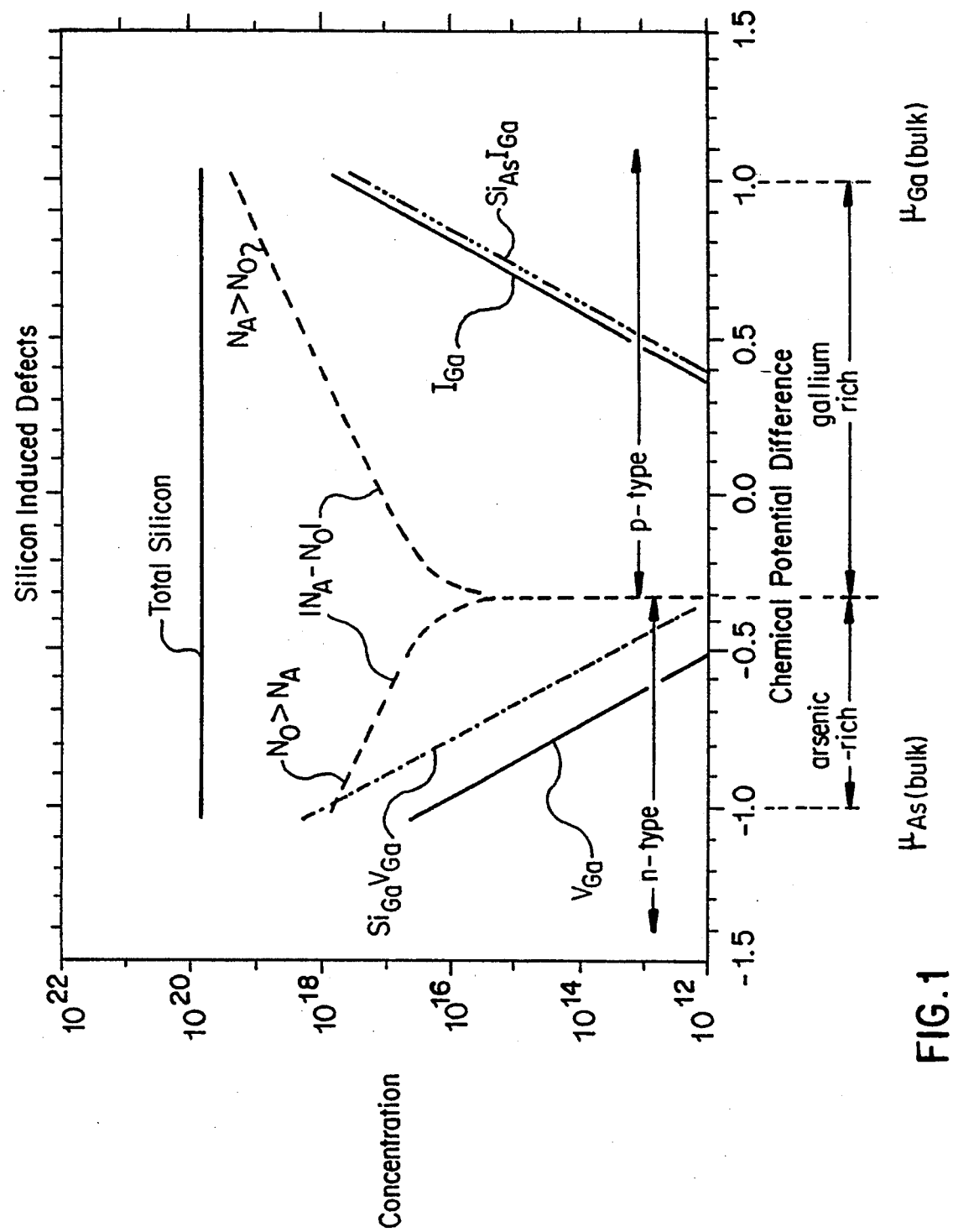
FIG. 1 is a diagram showing the effects of silicon induced defects in gallium arsenide under various conditions.

FIG. 1 shows a plot of the theoretical defect concentrations as a function of the atomic chemical potentials of arsenic and gallium. In determining the theoretical defect concentration shown in FIG. 1, a temperature 850° C. was assumed. Accordingly, the essentially horizontal line located at a concentration of approximately $10^{20}/cm^3$ and labelled "Total Silicon" denotes the theoretical total silicon concentration at the assumed temperature of 850° C. In determining the theoretical defect concentration shown in FIG. 1, the concentrations were determined on the basis of the energetics of silicon dopants and defects in gallium arsenide as a function of the arsenic and gallium chemical potentials. The arsenic and gallium chemical potentials vary over a certain range determined as discussed below. The maximum value for $\mu_{As}$ is $\mu_{As(bulk)}$, the chemical potential of pure elemental As. Similarly, the maximum value for $\mu_{Ga}$ is $\mu_{Ga(bulk)}$, the chemical potential of pure elemental Ga. If one of these limits is exceeded, the system is out of equilibrium and there is a driving force for the precipitation of the elemental bulk phase. For example, precipitates of Ga would form until the chemical potential of Ga drops below $\mu_{Ga(bulk)}$. Because equilibrium with the compound GaAs is maintained, the individual values of $\mu_{As}$ and $\mu_{Ga}$ do not vary independently, but vary so that the sum of the two is constant and equal to the chemical potential of the bulk compound GaAs. Thus, the most extreme Ga-rich conditions correspond to the case where $\mu_{Ga}=\mu_{Ga(bulk)}$ and $\mu_{As}+\mu_{Ga}=\mu_{GaAs(bulk)}$. This situation corresponds to a chemical potential difference of 1.0 eV. The most extreme As-rich conditions correspond to the case where $82_{As}=\mu_{As(bulk)}$ and $\mu_{As}+\mu_{Ga}=\mu_{GaAs(bulk)}$. This situation corresponds to a chemical potential difference of −1.0 eV.

As shown in FIG. 1, the chemical potential difference ranges from −1.0 eV, where the chemical potential $\mu_{As}$ of arsenic is equal to $\mu_{As\,(bulk)}$, to +1.0 eV, where the chemical potential $\mu_{Ga}$ of gallium is equal to $\mu_{Ga(bulk)}$. As shown in FIG. 1, as the chemical potential difference approaches −1.0 eV, the environment becomes increasingly arsenic-rich, while, when the chemical potential difference approaches +1.0 eV, the environment becomes increasingly gallium-rich. When the chemical potential difference is in the range of −0.4 to 1.0 eV, the environment can be described as gallium-rich, while when the chemical potential difference is in the range of −0.4 to −1.0 eV, the environment is described as arsenic-rich.

As shown in FIG. 1, as the environment becomes increasingly gallium-rich and the chemical potential difference rises above approximately 0.4 eV, the concentration of gallium interstitial defects ($I_{Ga}$) rises dramatically from approximately $10^{12}/cm^3$ at a chemical potential difference of approximately 0.4 eV to approximately $10^{18}/cm^3$ at a chemical potential difference of approximately 1.0 eV. Similarly, the concentration of defect complexes comprising gallium interstitials and silicon acceptors, $Si_{As}I_{Ga}$, closely parallels the increase in the concentration of gallium interstitial defects. These defects mediate the intermixing of layers of AlGaAs/GaAs in multiple layer heterostructures. Since there is a large excess of silicon acceptors, $Si_{As}$, over silicon donors, $Si_{Ga}$, the effect of in-diffusion of silicon under gallium-rich conditions is to disorder the GaAs/AlGaAs heterostructures into a p-type doped material. As is well-known with respect to n-type IILD, a critical level of doping is required before IILD is induced. A typical level of critical doping for n-type IILD materials is approximately $10^{12}-10^{18}$ defects. A similar level of critical doping in the p-type IILD material is expected.

The dashed line labeled $|N_D-N_A|$ shown in FIG. 1 indicates the absolute value of the difference between the number of acceptors, $N_A$, and the number of donors, $N_D$, in the GaAs/AlGaAs heterostructure. For As rich conditions $N_D > N_A$ and the material is n-type. For Ga-rich conditions $N_D < N_A$ and the material is p-type. The absolute value of the difference between the number of acceptors and donors directly indicates the degree of doping. As shown in FIG. 1, the absolute value $|N_A-N_D|$ indicates that under gallium-rich conditions, the material will be a strongly p-type doped material.

Accordingly, the formation of p-type material by impurity diffusion of silicon or germanium under gallium-rich conditions can be beneficially used with impurity induced layer disordering (IILD) techniques well known to those skilled in the art. As disclosed in U.S. Pat. No. 4,824,798 to Burnham, IILD performed with silicon doped with arsenic is known to produce n-type material of uniform composition by intermixing thin layers of different compositions. Thus the combination of well known IILD techniques with the method of this invention enables the beneficial formation of device structures comprising selected regions of both n and p-type material.

Figure 2:
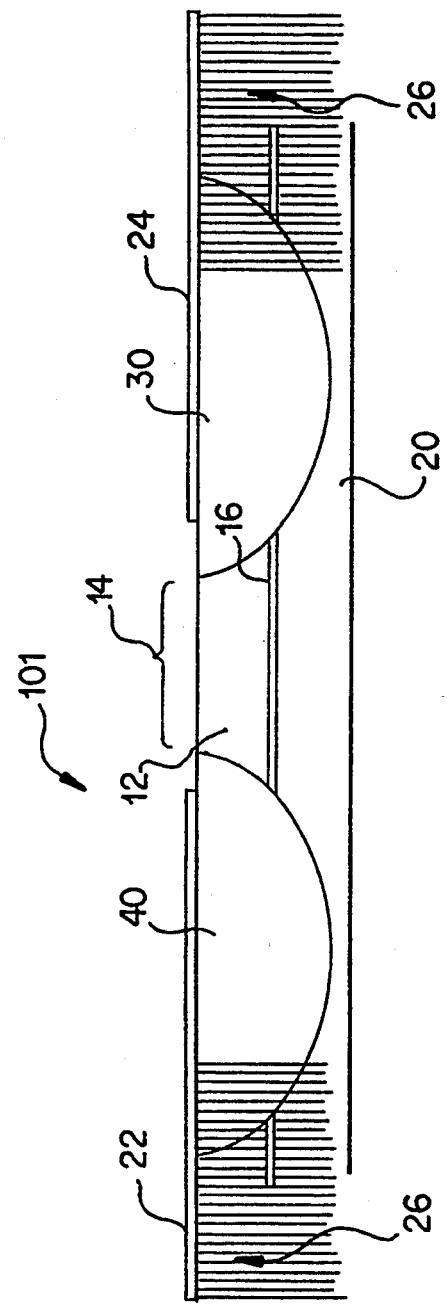
FIG. 2 is a cross-sectional view of a laterally injected diode laser made from a material formed by the present method.

Reference is now made to FIG. 2 wherein is illustrated a first embodiment of a p-type IILD region made using this invention. Laterally injected diode laser 101 comprises a substrate 10 of semi-insulating GaAs upon which is epitaxially deposited a cladding layer 20 of n-Ga$_{1-x}$Al$_x$As; an active waveguide layer 16 being undoped, p-type doped or n-type doped and comprising a relatively thin conventional double heterostructure active layer, an active single quantum well of either GaAs or Ga$_{1-y}$Al$_y$As sandwiched between carrier confinement layers of Ga$_{1-z}$Al$_z$As where $x > z > y$, or a multiple quantum well structure of alternating well layers of GaAs or Ga$_{1-y}$Al$_y$As and corresponding barrier layers of either AlAs or Ga$_{1-y'}$Al$_{y'}$As, sandwiched between carrier confinement layers of Ga$_{1-z}$Al$_z$As where $x > z \geq y' > y$; and a cladding layer 12 of p-Ga$_{1-x'}$Al$_{x'}$As where $x' \approx x$. The epitaxial deposition may be via layer growth techniques known as metalorganic vapor deposition or molecular beam epitaxy, which are known in the art. Within the epitaxially deposited layers, an optical waveguide 14 is formed by diffusing silicon into regions 24 and 40 and thereby intermixing the multiple semiconductor layers to form a uniform region of higher bandgap and lower refractive index than active waveguide layer 16.

Figure 3:
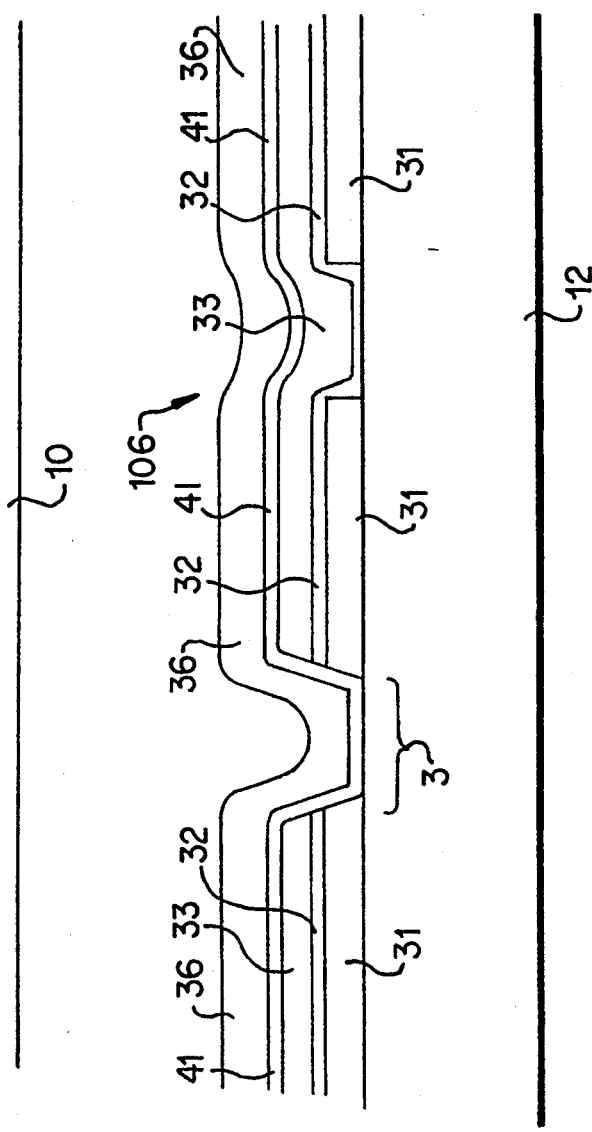
FIG. 3 is a cross-sectional view of the laterally injected diode laser of FIG. 2 showing a first embodiment of the present method prior to annealing.

Reference is now made to FIG. 3 for the purpose of describing the formation of the laterally injected diode laser according to the method of this invention, After uniform layers 12–20 are formed, a Si$_3$N$_4$ mask 31 is formed on the top of layer 12 with an opening above the area where the n-type diffused/disordered region 30 will be formed. An arsenic-rich silicon layer 32 is then deposited on layer 12 through the opening in the Si$_3$N$_4$ mask and capped with a second layer of Si$_3$N$_4$ 33. Similarly, a window 34 is then opened in the Si$_3$N$_4$/Si/-Si$_3$N$_4$ layer through which a gallium-rich silicon layer 41 is deposited on confinement layer 12 above the area where the p-type diffused/disorder region 40 will be formed. The gallium-rich silicon layer 41 is then capped with a final Si$_3$N$_4$ cap layer 36 and the entire heterostructure 106 is annealed at a high temperature for a sufficiently long time, e.g. 6 to 10 hours. The high temperature is preferably in the range of 800 to 900° C.

By annealing the capped heterostructure, the silicon in the arsenic-rich silicon layer 31 and the silicon in the gallium-rich silicon layer 41 diffuse into the epitaxial layers 12–20 to form the disordered regions 30 and 40. Because layer 31 is arsenic-rich, the silicon diffuses into the heterostructure layers in an arsenic-rich environment. The presence of excess arsenic induces Ga vacancies that cause the diffusing silicon to be a donor impurity, thereby forming an n-type diffusion region 30 under the arsenic-rich layer 31, as shown in FIG. 2. Similarly, because region 41 is gallium-rich, the silicon diffuses into the heterostructure layers in a gallium-rich environment. The presence of excess gallium induces arsenic vacancies which cause the diffusing silicon to be an acceptor impurity, thereby forming a p-type diffusion region 40 under the gallium-rich layer 41, as shown in FIG. 2.

In an alternate method for forming the laterally injected diode laser 101, the gallium-rich silicon layer 41 is replaced with an undoped silicon layer 37 and only the arsenic-rich silicon layer 32 is capped with Si$_3$N$_4$ layer 33, as shown in FIG. 4. Heterostructure 107 is then annealed at a high temperature and in a sealed ampoule containing gallium in an amount appropriate to forming a gallium-rich environment. For an ampoule volume of 3 cm$^3$, 20 to 60 mg of gallium would typically be used. Alternately, the arsenic-rich silicon layer 32 is replaced with undoped silicon and only the gallium-rich silicon layer 41 is capped with Si$_3$N$_4$. The resulting heterostructure is then annealed at a high temperature and in a sealed ampoule containing arsenic in an amount appropriate to forming an arsenic-rich environment. For an ampoule volume of 3 cm$^3$, 30 mg of arsenic would typically be used. In either alternate method, annealing the heterostructure causes the exposed silicon to diffuse into the heterostructure layers to form an p-type diffusion region 40 when the environment is gallium-rich or an n-type diffusion region 30 when the environment is arsenic-rich, while silicon from the capped silicon layer 32 or 41 diffuses into the heterostructure layers to form the other of the n-type or p-type diffusion regions 30 or 40, depending on whether it is arsenic-rich or gallium-rich.

A second device structure in which p-type IILD can be beneficially used is a p-n-p heterojunction bipolar transistor (HBT) as taught in U.S. Pat. 4,987,468 to Thornton, incorporated herein by reference. FIG. 5 illustrates a P-N-P HBT made with the method of this invention. The HBT 102 comprises an n-type substrate 110; a lower confinement layer 116 of Al$_x$Ga$_{1-x}$As; an active base layer 114 of GaAs or Al$_y$Ga$_{1-y}$As where $x > y$; and an upper confinement layer 112 or Al$_x$Ga$_{1-x}$As. Two p-type diffusion regions 40 are formed on either side of the n-type base region 117. By appropriately biasing HBT 102, one of the p-type diffusion regions 40 can be made to function as the collector of the P-N-P bipolar transistor, while the other p-type diffusion region 40 functions as the emitter of the P-N-P bipolar transistor. Separated metallization layers 22 and 24 are formed over the p-type diffusion regions 40 to serve as a collector contact 22 and an emitter contact 24. The P-N-P bipolar transistor 102 is then electrically isolated from the surrounding regions of the heterostructure layers by proton bombarded regions 26. Metallization layer 28 is formed on the substrate to serve as a base contact.

The p-type diffusion regions 40 are formed by the capping embodiment of the present invention as set forth above and shown in FIG. 3. Alternately, the p-type diffusion regions 40 are formed by forming silicon layers 37 over the layer 112 and annealing the heterostructure 107 and the exposed silicon layers 37 in the gallium-rich atmosphere as set forth above. In this case, as both regions are the same type, cap layer 33 shown in FIG. 4 is not needed. An advantage of this P-N-P structure, compared to the analogous structure disclosed in U.S. Pat. No. 4,987,468, is that it is made on an n-type substrate which is most common, least expensive, and highest quality.

The ability to make p-type IILD regions is especially beneficial when making monolithically integrated structures. According to this invention, integrated structures are beneficially made by simultaneously forming n-type and p-type IILD regions by controlling the dopant impurity in the silicon layer and/or by controlling the ambient environment during annealing as described above. The simultaneous formation of the n-type and p-type IILD regions is a significant advantage since a second annealing following completion of one anneal causes changes in the depth and shape of the completed disordered region.

Figure 6:
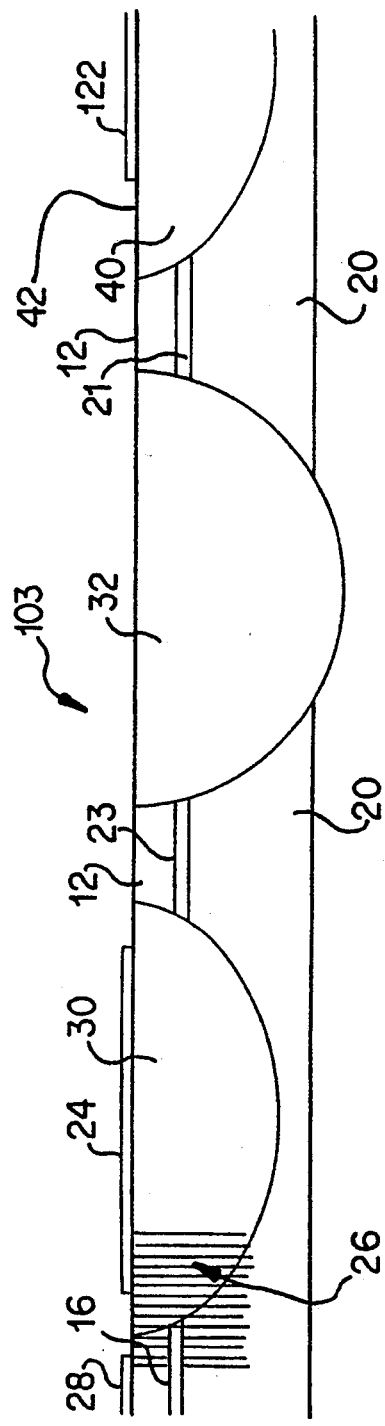
FIG. 6 is a cross-sectional view of a monolithic N-P-N transistor and laser formed from the material made by the present method.

For example, a monolithic N-P-N transistor and laser 103 can be made as shown in FIG. 6. Integrated transistor/laser 103 comprises a semi-insulating substrate 10 of GaAs upon which is epitaxially deposited a cladding layer 20 of p-$Ga_{1-x}Al_xAs$; an active p-type multilayer 16 which serves as the active waveguide 21 in the laser section and as the base channel 23 in the transistor section; and a cladding layer 12 of p-$Ga_{1-x}Al_xAs$. The p-type multilayer 16 comprises a single quantum well of p-GaAs or p-$Ga_{1-y}Al_yAs$, or a single quantum well of either p-GaAs or p-$Ga_{1-y}Al_yAs$ sandwiched between carrier confinement layers of p-$Ga_{1-z}Al_zAs$, or a multiple quantum well structure of alternating well layers of p-GaAs or p-$Ga_{1-y}Al_yAs$ and corresponding barrier layers of either AlAs or P-$Ga_{1-y'}Al_{y'}As$ sandwiched between carrier confinement layers of $Ga_{1-z}Al_zAs$, where $x > z \geq y' > y$. All of these layers may be deposited with the well known techniques of metalorganic vapor deposition or molecular beam epitaxy.

Within the epitaxially deposited layers, an N-P-N transistor and separated laser are formed to make the monolithic laser/transistor 103. The transistor of this structure comprises an n-type disordered region 30 which serves as the transistor emitter, n-type disordered region 32 which serves as the transistor collector, and base channel 23 which is formed in the p-type multilayer 16 between disordered regions 30 and 32. The laser of this structure is formed between p-type disordered region 40 and n-type disordered region 32. Thus region 32 is simultaneously the cathode of the laser and the collector of the transistor. Electrical contacts are made to integrated structure 103 through contact 122, which is connected to the laser anode, contact 24, which is connected to the transistor emitter, and contact 28, which remotely accesses the base channel. Electrical isolation between the base contact and the transistor emitter is provided by proton bombarded region 26. An important feature of disordered region 32 is that it extends substantially through all the epitaxially deposited layers and into the semi-insulating substrate 10 in order to electrically isolate the laser from the transistor base.

Integrated structure 103 is beneficially made according to this invention as described previously. Appropriate masking is performed at each step to define the desired structures as is well known in the art. After appropriate source layers of silicon have been deposited, the n-type and p-type disordered regions are formed simultaneously by controlling the arsenic and gallium content of the source layers and the ambient during annealing. However a partial annealing is required with only the silicon source layer for region 32 deposited on the wafer in order to make region 32 deeper than regions 30 and 40 as illustrated in FIG. 6.

Alternatively, an integrated transistor/laser can be formed by combining a P-N-P transistor and a laterally injected laser. The geometry of the integrated structure is the same as illustrated in FIG. 6 with all the epitaxially layers doped n-type instead of p-type, disordered regions 30 and 32 made with p-type diffusions and disordered region 40 made with an n-type diffusion according to the method of this invention. Region 30 remains the emitter of the transistor and region 32 remains the collector. However region 40 becomes the cathode for the laser. Contact 28 continues to provide remote access to the base channel 23.

P-type IILD can also be beneficially used to make surface emitting lasers with a structure as disclosed in U.S. Pat. No. 5,062,115 to Thornton, incorporated herein by reference. For example FIG. 7 illustrates a circular surface emitting laser 105 made with p-type IILD. FIG. 7A shows the top plane view of laser 105 while FIG. 7B shows a cross sectional view of laser 105. As shown in FIG. 7A, the laser anode 124 forms an annulus. The bisector line A shown in FIG. 7A corresponds to the line A shown in FIG. 7B.

Surface emitting laser 105 comprises an n-type substrate 110 of n-GaAs upon which is epitaxially deposited a wide bandgap layer 112 of n-$Ga_{1-x}Al_xAs$, a multilayer reflector 60, a spacer layer 62 of n-$Ga_{1-y}Al_yAs$, an active multilayer 16 being undoped or doped n-type, a second spacer layer 12 of n-$Ga_{1-y}Al_yAs$, where $x \leq y$, and a dielectric stack 50 deposited on the surface of spacer layer 12. Multilayer reflector 60 comprises an alternating stack of n-$Ga_{1-z}Al_zAs$ and n-$Ga_{1-z'}Al_{z'}As$, where $z \neq z'$, which is designed to provide high optical reflectivity at the lasing wavelength as known to those skilled in the art. Multilayer 16 can comprise a thin layer of either n-GaAs or n-$Ga_{1-w}Al_wAs$, or a quantum well layer of either n-GaAs or n-$Ga_{1-w}Al_wAs$, or a multiple quantum well structure of quantum well layers of either n-GaAs or n-$Ga_{1-w}Al_wAs$ alternating with corresponding barrier layers of either AlAs or $Ga_{1-y}Al_yAs$, where $v \geq y > w$.

Surface emitting laser 105 is beneficially made according to this invention using either of the two methods described previously. Appropriate masking is performed to define the desired annulus as is known in the art. The surface emitting laser is then defined within the epitaxially deposited layers by diffusing silicon in annular region 40 under gallium-rich conditions according to the principles of this invention. Since an n-type region is not required in the surface emitting laser 105 shown in FIG. 7B, p-type diffusion region 40 is formed with either an uncapped, undoped silicon layer 37 surrounded by a gallium-rich atmosphere or a capped gallium-rich silicon layer 41 as described above. Under appropriate time and conditions, impurity induced layer disordering will occur and thereby form a cylindrical surface emitting laser cavity by intermixing the multiple epitaxial layers in region 40. The lateral boundary of the cavity is the interface between the mixed and non-mixed multiple layers and corresponds approximately to the diffusion front of the silicon. The abruptness of the interface obtained with silicon induced layer disordering enables the fabrication of this structure, whereas previous techniques known in the art for p-type laser disordering produce a diffuse interface which is inadequate to make a useful device in this way. An important feature of this structure is that region 40 extends through active multilayer 16. Region 40 may also beneficially extend through reflector 60 and into the wide bandgap layer 112, as shown in FIG. 7B, to provide increased optical confinement. The optical mirrors of the laser cavity are formed by multilayer reflector 60 and dielectric stack 50.

After the p-type diffusion region is formed, the active device is electrically isolated from the rest of the layers by bombarding regions 26 with protons. The laser anode 124 is formed by a metallization layer on the top surface of the region 40, while the laser cathode 122 is formed by a metallization on the bottom surface of the substrate 110. A hole, centered on the undiffused portion of active multilayer 16, is not covered with contact metal in order that light is emitted from the structure. Dielectric stack 50 is deposited on this opening to provide the optical reflection needed to sustain laser operation.

In the circular surface emitting laser shown in FIGS. 7A and 7B, holes are laterally injected into the active layer 16 from disordered region 40 while electrons are injected from the substrate 110 in a direction perpendicular to the epitaxial layers 60. Thus current flows from the anode 124 and sequentially through the disordered region 40, the active layer 16, the spacer layer 62 the reflector 60, the wide bandgap layer 112, and the substrate 110 into the cathode 122. The emitting laser mirror is formed by applying multiple dielectric layers 50 on the top of spacer layer 12 in the center of the annular laser cathode 124 as one of the last processing steps.

A significant advantage of this structure formed with p-type disordered region is that the substrate is n-type. N-type disordered regions of the prior art, c.f. U.S. Pat. No. 5,062,115, require a p-type substrate which is less desirable than n-type because of its increased cost and inferior quality.

Surface emitting laser 105 and transistor 102 can be beneficially combined in the same set of epitaxial layers to make a monolithic surface emitting laser/transistor, in the same manner as was done for the monolithically integrated transistor/laterally injected laser shown in FIG. 6.

According to the method of the present invention, patterned reverse-biased junctions can be beneficially formed by controlling the stoichiometry of the as-grown epitaxial layers. This method is illustrated with reference to FIG. 8, which shows a laser structure 109 with reverse biased junctions 39 formed in the disordered regions 40. Such localized p-n junctions are formed simultaneously with the formation of the disordered regions 40 during the diffusion of silicon. The dopant type produced by the diffusing silicon during the annealing process is preselected during epitaxial growth of the heterostructure layers by the type of intrinsic defect introduced at any point in any layer. For example, if the dominating intrinsic defects are arsenic vacancies or gallium precipitates, the silicon impurity acts as an acceptor and the disordered material will be p-type. On the other hand, if the intrinsic defects are gallium vacancies or arsenic precipitates, the silicon impurity will act as a donor and the material will be n-type. Thus, placement of a p-n junction is controlled by changing the epitaxial growth conditions between a gallium-rich environment and an arsenic-rich environment, in order to change the type of intrinsic defect present in the epitaxial layer.

Figure 8:
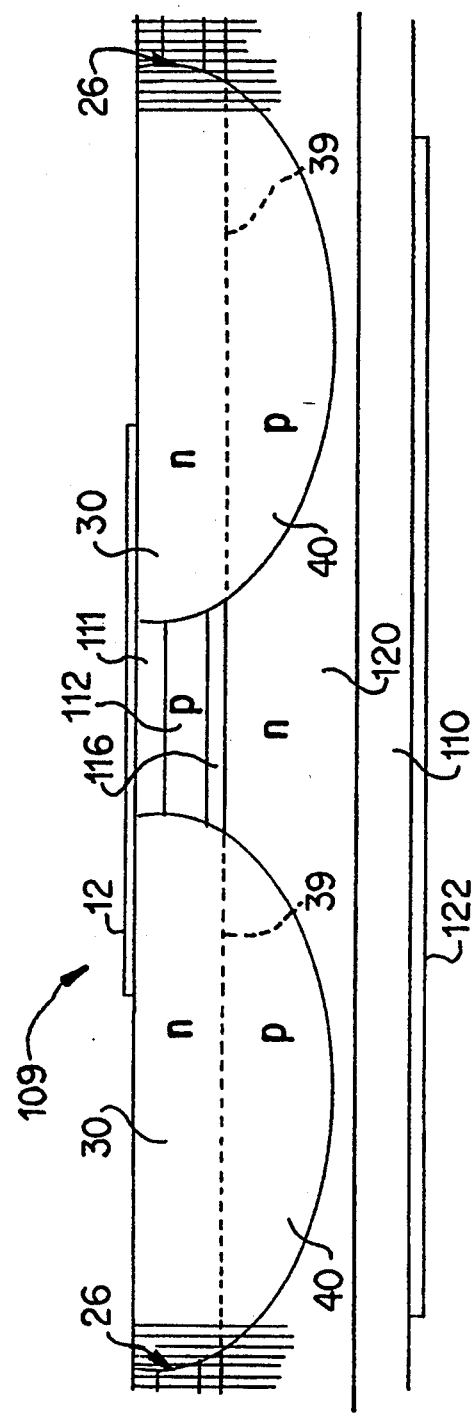
FIG. 8 is a cross-sectional view of a diode laser with a buried reversed-biased junction formed from the material made by the present method.

An embodiment of a p-n junction made using the method of this invention is shown in FIG. 8. Laser structure 109 comprises a substrate 110 of n-type GaAs upon which is epitaxially deposited a cladding layer 120 of n-$Ga_{1-x}Al_xAs$; an active waveguide 116 being un-doped, p-type doped or n-type doped and comprising a relatively thin conventional double heterostructure active layer, an active single quantum well of either GaAs or $Ga_{1-y}Al_yAs$ sandwiched between carrier confinement layers of $Ga_{1-z}Al_zAs$ where $x>z>y$, or a multiple quantum well structure of alternating well layers of GaAs or $Ga_{1-y}Al_yAs$ and corresponding barrier layers of either AlAs or $Ga_{1-y'}Al_{y'}As$, sandwiched between carrier confinement layers of $Ga_{1-z}Al_zAs$ where $x>z\geq y'>y$; a cladding layer 112 of p-$Ga_{1-x'}Al_{x'}$As where $x'\approx x$; and a contact layer 111 of p-GaAs.

The multiple layers are grown such that layers 111, 112, and 116 contain intrinsic Ga vacancies and are therefore arsenic-rich, while layer 120 contains intrinsic As vacancies and is therefore gallium-rich. The epitaxial deposition may be via layer growth techniques known as metalorganic vapor deposition or molecular beam epitaxy, which are known in the art.

According to the method of this invention, p-n junction 39 is formed by depositing undoped silicon on layer 111 above where disordered regions 30/40 are desired, capping the silicon with $Si_3N_4$, and annealing the resulting structure for an appropriate length of time, typically 6 to 10 hours at a temperature between 800° and 900° C. The silicon diffuses into the epitaxial layers 111-120 to form the silicon impurity induced disordered regions 30/40. Because layers 111, 112, and 116 are arsenic-rich, the silicon diffuses in what is effectively an arsenic-rich environment thereby causing the silicon to be a donor impurity and disordered region 30 to be n-type. On the other hand, because layer 120 is gallium-rich, the silicon diffuses in what is effectively an gallium-rich environment, thereby causing the silicon to be an acceptor impurity and disordered region 40 to be p-type. Thus the location of the p-n junction at the interface of regions 30 and 40 is controlled to occur near the interface of active layer 116 and cladding layer 120.

According to an alternate method of the present invention, p-n junction 39 can be beneficially formed by changing the environment of the epitaxial layers during the diffusion. In this embodiment, the undoped silicon layer is not capped with $Si_3N_4$ so that it is exposed to the ambient environment. The diffusion proceeds first in a gallium-rich environment so that the diffusing silicon produces p-type disordered material in regions 30 and 40. Once the p-type diffusion is sufficiently deep, the environment is changed to arsenic-rich and the annealing is continued. Continued annealing in the presence of excess arsenic then changes region 30 to n-type, thereby producing the p-n junction 39. Control of the exact location of the p-n junction within the disordered region is more difficult in this method than when using the first method. Changing the environment during the diffusion can also be used in combination with intrinsic defects to assist in selection of n-type or p-type doping in the disordered region.

Figure 9:
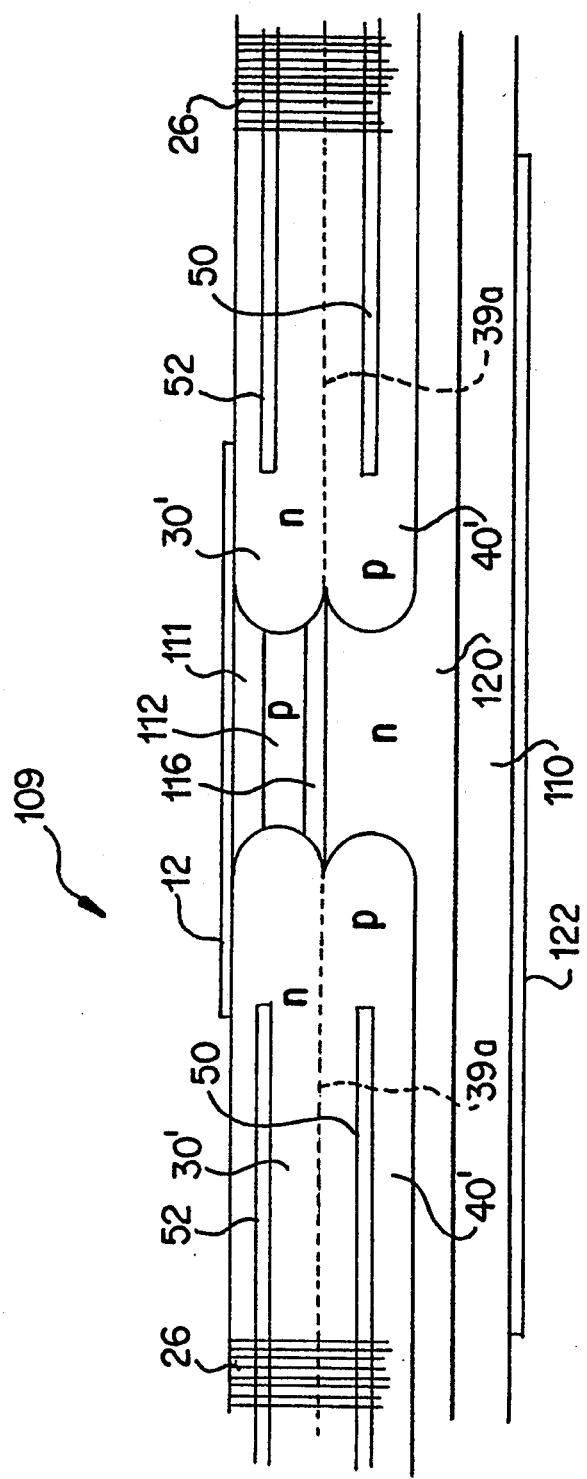
FIG. 9 shows a further method for forming the buried reversed biased junction diode laser.

A further method for producing the buried reversed-biased junction diode laser is shown in FIG. 9. A complete description of the method for forming and annealing the diode laser of FIG. 9 is set forth in U.S. Pat. No. 5,013,684 to Epler and Paoli and incorporated herein by reference. As shown in FIG. 9, a first layer or spike of doped silicon 50 is formed in the cladding layer 120, while a second layer or spike of doped silicon 52 is formed in the cladding layer 112. One of the silicon layers 50 and 52 is heavily doped with arsenic to provide an arsenic rich environment. The other of the layers 50 and 52 is heavily doped with gallium to provide a gallium-rich environment. In the example shown in FIG. 9, the first layer 50 is heavily gallium doped, while the second layer 52 is heavily arsenic doped.

After the layers 50 and 52 are formed in the device, the device is annealed. Since the first layer 50 of the spike is gallium-rich, the silicon diffuses into the device in a gallium-rich environment. Likewise, since the second layer 52 is arsenic-rich, the silicon diffuses into the device in an arsenic-rich environment. The IILD disordered regions 30' and 40' grow as the silicon diffuses into the device from the layers 50 and 52. Eventually, the diffusion fronts from the layers 50 and 52 meet at a junction 39a to form the buried junction device, as shown in FIG. 9. The diffused silicon from the gallium-rich layer 50 acts as an acceptor impurity, causing the region 40' on one side of the junction 39a to be doped p-type. The diffused silicon from the arsenic-rich layer 52 acts as a donor impurity, causing the region 30' on the other side of the junction 39a to be doped n-type. The doped regions 30' and 40' form the lateral buried reverse biased junction 39a.

Once the disordered regions 30' and 40' have been formed proton bombarded regions 26 are formed to isolate the laser structure 109 from the rest of the epitaxial layers. A first metallization layer is placed on the bottom of the n-type substrate 110 to form the laser cathode 122, while a second metallization layer is placed on the top surface of the contact layer 111 to form the laser anode 124.

While this invention has been described in conjunction with a specific method, it is evident that many alternatives, modifications and variations will be apparent to those skilled in the art. Accordingly, it is intended to embrace all such alternatives, modifications and variations as fall within the spirit and broad scope of the appended claims.

What is claimed is:

1. A method for producing p-type impurity induced layer disordering in multilayer structures of semiconductor material comprising the steps of:
   (i) providing a source of a disordering agent on or within the multilayer structure;
   (ii) annealing the semiconductor material under Group III material-rich conditions to in-diffuse the disordering agent as a p-type dopant and simultaneously induce layer disordering in the semiconductor material.

2. The method of claim 1, wherein the disordering agent is at least one of silicon and germanium.

3. The method of claim 1, wherein the semiconductor material contains at least one of aluminum, indium, gallium and arsenic.

4. A method for producing a semiconductor device, wherein the semiconductor device contains p-type doped material formed by the impurity induced disordering method of claim 1.

5. The method of claim 1, wherein the providing a source step comprises the step of providing a layer of Group III-rich disordering material over the semiconductor material.

6. The method of claim 1, wherein:
   the providing a source step comprises placing a layer of disordering material over the semiconductor material; and
   the annealing step comprises:
      placing the semiconductor material into a sealable ampoule, and
      providing a Group III-rich environment in the sealable ampoule.

7. A method for producing p-type regions and n-type regions in multilayer structures of semiconductor material by impurity induced layer disordering, comprising the steps of:
   providing a source of a single disordering agent for p-type and n-type regions;
   annealing the multilayer semiconductor material, wherein the p-type regions are annealed under Group III material rich conditions and the n-type regions are annealed under Group V material rich conditions.

8. The method of claim 7, wherein the disordering agent is one of silicon and germanium.

9. The method of claim 7, wherein the semiconductor material contains at least one of aluminum, indium, gallium and arsenic.

10. The method of claim 7, further comprising the step of forming the semiconductor material into a semiconductor device.

11. The method of claim 10, wherein the semiconductor device is one of a surface emitting laser device and a reversed-biased p-n junction device.

12. The method of claim 10, wherein the semiconductor device is one of a monolithically integrated device comprising a laterally injected laser and a bipolar transistor, and a monolithically integrated device comprising a surface emitting laser and a bipolar transistor.

13. The method of claim 7, further comprising the step of forming a reversed-biased p-n junction within the doped semiconductor region.

14. The method of claim 13, wherein the step of forming the reversed-biased p-n junction comprises the step of controlling intrinsic defect types in different layers of the semiconductor material.

15. The method of claim 13, wherein the step of forming the reversed-biased p-n junction comprises the step of controlling ambient environmental conditions during the annealing step.

16. The method of claim 7, wherein the providing a source step comprises the steps of providing a layer of Group III-rich disordering material over the semiconductor material.

17. The method of claim 7, wherein:
   the providing a source step comprises placing a layer of disordering material over the semiconductor material; and
   the annealing step comprises:
      placing the semiconductor material into a sealed ampoule, and
      providing a Group III-rich environment in the sealed ampoule.

18. A method for producing a buried, reverse biased junction semiconductor device, comprising the steps of:
   providing a substrate;
   forming a plurality of semiconductor layers over the substrate as a multiple layer structure;
   forming a first silicon layer doped with a group III material in a first portion of the multiple layer structure;
   forming a second silicon layer doped with a group V material in a second portion of the multiple layer structure; and
   annealing the substrate to diffuse silicon from first and second layers into the first and second portions of the multiple layer structure under group III-rich and group V-rich environments, respectively, wherein the multiple layers are layer disordered and a buried junction is formed between a group III diffused region and a group V diffused region of the multiple layer structure.

19. The method of claim 18, wherein the group III material is at least one of gallium and indium.

20. The method of claim 18, wherein the group V material is arsenic.

* * * * *

UNITED STATES PATENT AND TRADEMARK OFFICE
CERTIFICATE OF CORRECTION

PATENT NO. : 5,376,583
DATED : December 27, 1994
INVENTOR(S) : John E. Northrup et al.

It is certified that error appears in the above-identified patent and that said Letters Patent is hereby corrected as shown below:

Column 1,
Line 4, insert as a new paragraph:
-- This invention was made with Government support under Agreement No. N00014-82-C-0244 awarded by the Office of Naval Research. The Government has certain rights in this invention. --.

Signed and Sealed this

Thirteenth Day of June, 2006

JON W. DUDAS
*Director of the United States Patent and Trademark Office*

UNITED STATES PATENT AND TRADEMARK OFFICE
CERTIFICATE OF CORRECTION

PATENT NO. : 5,376,583  Page 1 of 1
APPLICATION NO. : 08/174911
DATED : December 27, 1994
INVENTOR(S) : John E. Northrup et al.

It is certified that error appears in the above-identified patent and that said Letters Patent is hereby corrected as shown below:

Col. 1, lines 10-11 replace: "Agreement No. N00014-82-C-0244"

with: -- Agreement No. N00014-92-C-0009 --

Signed and Sealed this

Ninth Day of February, 2010

David J. Kappos
*Director of the United States Patent and Trademark Office*